(12) United States Patent
Kudoh et al.

(10) Patent No.: US 11,618,247 B2
(45) Date of Patent: Apr. 4, 2023

(54) THERMALLY CONDUCTIVE SHEET AND PRODUCTION METHOD FOR SAME

(71) Applicant: SEKISUI POLYMATECH CO., LTD., Saitama (JP)

(72) Inventors: Hiroki Kudoh, Kawaguchi (JP); Miho Ishihara, Tokyo (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 0 days.

(21) Appl. No.: 17/770,539

(22) PCT Filed: Oct. 26, 2020

(86) PCT No.: PCT/JP2020/040121
§ 371 (c)(1),
(2) Date: Apr. 20, 2022

(87) PCT Pub. No.: WO2021/085383
PCT Pub. Date: May 6, 2021

(65) Prior Publication Data
US 2022/0347996 A1 Nov. 3, 2022

(30) Foreign Application Priority Data
Nov. 1, 2019 (JP) .............................. JP2019-200095

(51) Int. Cl.
*B32B 27/00* (2006.01)
*B32B 38/00* (2006.01)
(Continued)

(52) U.S. Cl.
CPC .......... *B32B 38/0004* (2013.01); *B32B 27/08* (2013.01); *B32B 27/20* (2013.01);
(Continued)

(58) Field of Classification Search
CPC ......... B32B 27/00; B32B 27/08; B32B 27/20; B32B 38/00; B32B 38/0004
See application file for complete search history.

(56) References Cited

U.S. PATENT DOCUMENTS

2004/0152829 A1* 8/2004 Tobita ................ C09K 19/3809
524/404
2007/0003721 A1 1/2007 Ohta et al.
(Continued)

FOREIGN PATENT DOCUMENTS

CN 114341273 4/2022
JP 9-283955 10/1997
(Continued)

OTHER PUBLICATIONS

International Search Report dated Jan. 12, 2021 in corresponding International (PCT) Patent Application No. PCT/JP2020/040121.
(Continued)

*Primary Examiner* — Jacob T Minskey
*Assistant Examiner* — Matthew Hoover
(74) *Attorney, Agent, or Firm* — Wenderoth, Lind & Ponack, L.L.P.

(57) ABSTRACT

Provided is a thermally conductive sheet having high thermal conductivity not only in a thickness direction of the sheet but also in one direction along a plane direction of the sheet. The thermally conductive sheet is a thermally conductive sheet containing a scaly filler 12 in a polymer matrix 11, wherein the scaly filler 12 is oriented such that a long axis direction of a scale surface is along one of a first direction that is a thickness direction of the thermally conductive sheet and a second direction that is perpendicular to the first direction, and a transverse axis direction that is
(Continued)

perpendicular to the long axis direction in the scale surface is along the other of the first direction and the second direction.

11 Claims, 3 Drawing Sheets

(51) Int. Cl.
  *B32B 27/08* (2006.01)
  *B32B 27/20* (2006.01)

(52) U.S. Cl.
  CPC ... *B32B 2038/0052* (2013.01); *B32B 2250/24* (2013.01); *B32B 2250/44* (2013.01); *B32B 2262/106* (2013.01); *B32B 2264/102* (2013.01); *B32B 2264/108* (2013.01); *B32B 2264/303* (2020.08); *B32B 2264/308* (2020.08); *B32B 2305/30* (2013.01); *B32B 2307/302* (2013.01); *B32B 2307/732* (2013.01); *B32B 2313/02* (2013.01)

(56) References Cited

U.S. PATENT DOCUMENTS

| | | |
|---|---|---|
| 2011/0192588 A1 | 8/2011 | Suzuki et al. |
| 2014/0293626 A1 | 10/2014 | Yoshikawa et al. |
| 2015/0030835 A1 | 1/2015 | Tanaka et al. |
| 2016/0118316 A1 | 4/2016 | Aramaki et al. |
| 2019/0176448 A1* | 6/2019 | Mukohata ............ H01L 23/373 |
| 2020/0243414 A1* | 7/2020 | Kudoh ................. H01L 23/373 |
| 2021/0057304 A1 | 2/2021 | Koyano |

FOREIGN PATENT DOCUMENTS

| | | |
|---|---|---|
| JP | 2001-110961 | 4/2001 |
| JP | 2002-26202 | 1/2002 |
| JP | 2002-121393 | 4/2002 |
| JP | 2004-51852 | 2/2004 |
| JP | 2006-274094 | 10/2006 |
| JP | 2007-12913 | 1/2007 |
| JP | 2009-94110 | 4/2009 |
| JP | 2011-184663 | 9/2011 |
| JP | 2011-208024 | 10/2011 |
| JP | 2014-14809 | 1/2014 |
| JP | 2014-27144 | 2/2014 |
| JP | 2014-67924 | 4/2014 |
| JP | 2014-148094 | 8/2014 |
| JP | 2015-35580 | 2/2015 |
| JP | 2016-222925 | 12/2016 |
| JP | 2017-52973 | 3/2017 |
| JP | 2019-26884 | 2/2019 |
| JP | 2019-108496 | 7/2019 |
| WO | 2008/053843 | 5/2008 |
| WO | 2010/047278 | 4/2010 |
| WO | 2013/099089 | 7/2013 |
| WO | 2017/179318 | 10/2017 |
| WO | 2018/030430 | 2/2018 |
| WO | 2019/160004 | 8/2019 |

OTHER PUBLICATIONS

Catalog of BN powder (PolarThermo) "PT-110", with English translation.
Website of East Japan Carbon Co., Ltd., https://eastjp-carbon.co.jp/list/graphitepowder, with English translation.
Written Opinion of the International Searching Authority dated Jan. 12, 2021 in corresponding International (PCT) Patent Application No. PCT/JP2020/040121, with English translation.

* cited by examiner

THERMALLY CONDUCTIVE SHEET AND PRODUCTION METHOD FOR SAME

TECHNICAL FIELD

The present invention relates to a thermally conductive sheet and a method for producing the same.

BACKGROUND ART

In electronic devices such as computers, automobile parts, and cellular phones, radiators such as heat sinks are generally used to dissipate heat generated from heating elements such as semiconductor elements or mechanical parts. A thermally conductive sheet has been known to be arranged between the heating element and the radiator for the purpose of increasing a heat transfer efficiency to the radiator.

The thermally conductive sheet generally contains a polymer matrix and thermally conductive fillers dispersed in the polymer matrix. Moreover, the thermally conductive sheet may allow anisotropic fillers that have anisotropy in shape thereof to be oriented in one direction in order to increase thermal conductivity in a certain direction.

A thermally conductive sheet with anisotropic fillers oriented in one direction is produced by, for example, fabricating a plurality of primary sheets in which anisotropic fillers such as fibrous fillers are oriented along the sheet surface direction by stretching, etc., and then slicing a sheet vertically such that a plurality of the primary sheets are laminated and integrated. According to this producing method (hereinafter also referred to as "flow orientation method"), the thermally conductive sheet composed of a great number of laminated unit layers of minute thickness can be obtained. Moreover, the anisotropic fillers can be oriented in the thickness direction of the sheet, resulting in favorable thermal conductivity in the thickness direction (see, for example, PTL 1). The thermally conductive sheet having high thermal conductivity in the thickness direction enables to efficiently dissipate heat generated by a heating element to the outside in an electronic device.

CITATION LIST

Patent Literature

PTL1: JP 2014-27144 A

SUMMARY OF INVENTION

Technical Problem

Then, a heat spot where a temperature is locally increased, may occur inside electronic devices. In order to eliminate the heat spot, a thermal diffusion sheet having excellent thermal conductivity in the plane direction may be used. In general, since heat resistance of an electronic element varies depending on a type of the electronic element, if, for example, an element with low heat resistance is present on a substrate, it is necessary to prevent heat transfer in that direction. In this case, it is required to increase thermal conductivity in a specific direction in the plane, while decreasing thermal conductivity in one direction other than the direction. However, a conventional thermal diffusion sheet has inferior thermal conductivity in the thickness direction, so that it is inefficient in transferring heat generated by a heating element to a radiator, and diffuses heat isotopically, so that it is difficult to inhibit thermal conduction in a specific direction.

On the other hand, a thermally conductive sheet in which anisotropic fillers are oriented in the thickness direction of the sheet, which is obtained by the conventional flow orientation method, etc., has excellent efficiency of transferring heat generated by the heating element to the radiator, but has difficulty in increasing thermal conductivity in the direction along the plane direction of the sheet.

Therefore, an object of the present invention is to provide the thermally conductive sheet having high thermal conductivity not only in the thickness direction of the sheet but also in one direction along the plane direction of the sheet.

Solution to Problem

The present inventors have found, as a result of diligent experimentation that the aforementioned problems can be solved by comprising the following configuration and have completed the present invention. Namely, the present invention provides the following [1] to [12].

[1] A thermally conductive sheet comprising a scaly filler in a polymer matrix, wherein the scaly filler is oriented such that a long axis direction of a scale surface is along one of a first direction that is a thickness direction of the thermally conductive sheet and a second direction that is perpendicular to the first direction, and a transverse axis direction that is perpendicular to the long axis direction in the scale surface is along the other of the first direction and the second direction.

[2] The thermally conductive sheet according to [1], wherein the scaly filler is oriented such that the long axis direction is along the first direction and the transverse axis direction is along the second direction.

[3] The thermally conductive sheet according to [1], wherein the scaly filler is oriented such that the transverse axis direction is along the first direction and the long axis direction is along the second direction.

[4] The thermally conductive sheet according to any one of [1] to [3], wherein a first aspect ratio represented by a ratio of a length in the long axis direction to a length in the transverse axis direction, of the scaly filler (length in the long axis direction/length in the transverse axis direction) is 1.5 or more.

[5] The thermally conductive sheet according to any one of [1] to [4], wherein an average particle size of the scaly filler is 20 μm or larger.

[6] The thermally conductive sheet according to any one of [1] to [5], wherein the scaly filler comprises scaly graphite powder.

[7] The thermally conductive sheet according to any one of [1] to [6], wherein the scaly filler comprises scaly boron nitride powder.

[8] The thermally conductive sheet according to any one of [1] to [7], wherein the thermally conductive sheet further comprises a fibrous filler.

[9] The thermally conductive sheet according to [8], wherein the fibrous filler is a carbon fiber.

[10] The thermally conductive sheet according to any one of [1] to [9], wherein the thermally conductive sheet comprises a plurality of unit layers, wherein at least one of the plurality of unit layers comprises the scaly filler, and the plurality of unit layers are laminated along a third direction perpendicular to the first and second directions.

[11] The thermally conductive sheet according to any one of [1] to [10], wherein the thermally conductive sheet further comprises a non-anisotropic filler in the polymer matrix.

[12] A method for producing the thermally conductive sheet according to any one of [1] to [11], comprising the steps of:
preparing a mixture comprising a resin that is a precursor of the polymer matrix and the scaly filler;
subjecting the mixture to a flow orientation treatment to obtain a primary sheet while orientating the scaly filler;
laminating the primary sheets to obtain a laminated block; and
a step of cutting the laminated block along a laminating direction.

Advantageous Effects of Invention

According to the present invention, a thermally conductive sheet having high thermal conductivity can be provided not only in the thickness direction of the sheet but also in one direction along the plane direction of the sheet.

DESCRIPTION OF EMBODIMENTS

Hereinafter, the thermally conductive sheet according to embodiments of the present invention will be described in detail.

First Embodiment

Figure 1:
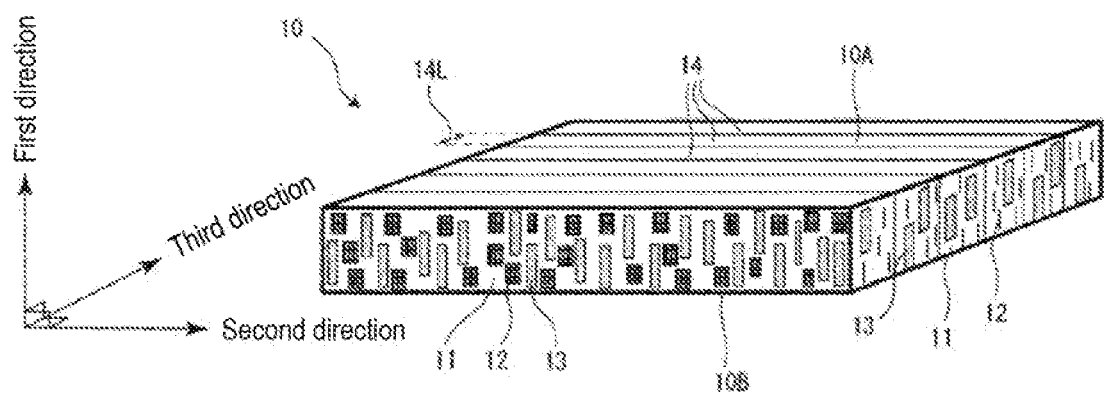
FIG. 1 is a schematic perspective diagram illustrating the thermally conductive sheet according to a first embodiment.
Figure 2:
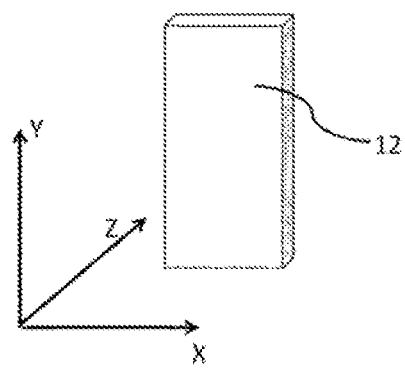
FIG. 2 is a schematic perspective diagram illustrating scaly fillers.

FIG. 1 is a schematic diagram of a thermally conductive sheet 10 of the first embodiment, and FIG. 2 is a schematic diagram to explain the details of a scaly filler 12. The thermally conductive sheet 10 according to the first embodiment contains a polymer matrix 11 and the scaly filler 12 dispersed in the polymer matrix 11. As shown in FIG. 2, the scaly filler 12 has a long axis direction Y that is referred to as a longitudinal direction in a scale surface, a transverse axis direction X that is referred to as a direction perpendicular to the long axis direction in the scale surface, and a thickness direction Z that is referred to as a thickness direction of the scaly filler 12 perpendicular to the long axis direction Y and the transverse axis direction X. The scaly filler 12 is a thermally conductive filler that increases thermal conductivity of the thermally conductive sheet 10.

In the thermally conductive sheet 10, the scaly filler 12 is oriented such that the long axis direction Y thereof is along the first direction that is the thickness direction of the thermally conductive sheet 10 and the transverse axis direction X is along the second direction that is perpendicular to the first direction. Here, the second direction is one direction in the plane direction of the sheet. Therefore, the thermally conductive sheet 10 also has favorable thermal conductivity in one direction in the plane direction of the thermally conductive sheet 10 in addition to in the thickness direction. Additionally, in the present description, a direction perpendicular to both the first and the second directions is referred to as a third direction. The third direction is one direction along the plane direction of the thermally conductive sheet 10.

The thermally conductive sheet 10 having favorable thermal conductivity in one direction in the plane direction in addition to the thickness direction allows heat to escape in the plane direction as well to prevent generation of heat spots, while enhancing a heat dissipation effect. Further, since the thermal conductivity is not so enhanced in directions other than one direction in the plane direction, it is also possible to prevent heat from being transmitted in the direction where, for example, an element with low heat resistance is present on a substrate.

The thermally conductive sheet 10 may contain an anisotropic filler other than the scaly filler 12 together with the scaly filler 12 as the thermally conductive filler dispersed in the polymer matrix 11. Specifically, as shown in FIG. 1, a fibrous filler 13 is preferably contained. The thermally conductive sheet containing the fibrous filler 13 in addition to the scaly filler 12 allows the fibrous filler 13 to be present, for example, between scaly filler 12 and scaly filler 12, to form a heat conduction path satisfactorily, enabling high thermal conductivity.

The fibrous filler 13 is oriented such that the fiber axis direction thereof is along the first direction that is the thickness direction of the sheet. By allowing the fibrous filler 13 to be oriented along the first direction, the thermally conductive sheet 10 can further increase the thermal conductivity in the thickness direction (first direction) of the sheet, facilitating the thermal conductivity along the first direction to be sufficiently higher than that along the second direction.

The thermally conductive sheet 10 also preferably contains a non-anisotropic filler (not shown) as the thermally conductive filler dispersed in the polymer matrix 11. The thermally conductive sheet 10 containing the non-anisotropic filler can appropriately interpose the fillers having thermal conductivity between the anisotropic fillers, such as the scaly fillers 12, resulting in the thermal conductivity being even favorable.

Additionally, in the present description, the anisotropic filler is a filler that has anisotropy in shape and can be oriented. The anisotropic filler usually has either of the aspect ratios of greater than 2. Moreover, the non-anisotropic filler is a filler that has substantially no anisotropy in shape, and is a filler that does not orient in a predetermined direction even in an environment where anisotropic fillers orient in that predetermined direction, such as under application of shear force as described below. The non-anisotropic filler is a filler having, for example, an aspect ratio thereof of 2 or less as described below.

In the present invention, the scaly filler 12 may be used alone as the thermally conductive filler contained in the polymer matrix 11, or both the scaly filler 12 and the fibrous filler 13 may be used, or the scaly filler 12 and the non-anisotropic filler may be combined for use. Further, the scaly filler 12, the fibrous filler 13, and the non-anisotropic filler may be combined for use.

Hereinafter, each material constituting the thermally conductive sheet according to the present embodiment will be described in more detail.

(Polymer Matrix)

The polymer matrix 11 is a member that holds the thermally conductive filler such as the scaly filler 12, and is preferably composed of a flexible rubber-like elastic body. The polymer matrix is formed from a resin that is a precursor thereof. It is noted that the term "precursor" as used herein is a concept that includes not only substances that become the polymer matrix 11 through a reaction as described below, but also substances that do not react and are identical to the polymer matrix 11.

In order to allow the anisotropic filler such as the scaly filler 12 to be contained in the polymer matrix 11 in a state of being oriented, the resin is required to have flowability upon an orientation step. For example, if the resin that is a precursor of the polymer matrix 11, is a thermoplastic resin, the anisotropic filler can be oriented in a state of being heated and plasticized. Moreover, if it is a reactive liquid resin and the anisotropic filler is oriented before curing and then cured while maintaining the state, a cured product with the anisotropic filler oriented can be obtained. Since the thermoplastic resin has relatively high viscosity and may undergo thermal degradation of the resin when plasticizing it to a low viscosity, the reactive liquid resin is preferably employed.

As the reactive liquid resin, a rubber or gel that is liquid before reaction and cures under predetermined conditions to form a crosslinked structure, is preferably used. The crosslinked structure is referred to a structure in which at least portion of a polymer is crosslinked three dimensionally to form a cured body that does not melt upon heating. Moreover, since a mixed composition is prepared by adding anisotropic fillers to the liquid resin and they are oriented in the flowable liquid resin, the reactive liquid resin preferably has a low viscosity, and preferably comprises properties allowing it to be cured under predetermined conditions after orientation.

A method for curing such reactive liquid resins, for example, a method for curing a thermosetting or photocurable material, can be exemplified, and thermosetting rubbers or gels are preferably used because they contain a large amount of fillers such as scaly fillers that shield light. More specifically, a silicone resin, urethane rubber that utilizes a reaction of a polyol and an isocyanate, an acrylic rubber that utilizes a radical or cationic reaction of acrylate, etc., can be exemplified, and the silicone resin is preferably used.

The silicone resin is not particularly limited as long as it is an organopolysiloxane, and a curable type silicone resin is preferably used. When the silicone resin is a curable type, it is obtained by curing a curable silicone composition. The silicone resin may be of an addition reaction type or any other type. In the case of the addition reaction type, the curable silicone composition is preferably composed of a silicone compound that serves as the main agent and a curing agent that cures the main agent.

The silicone compound used as a main agent is preferably an alkenyl group-containing organopolysiloxane, and includes specifically vinyl group-containing organopolysiloxanes, such as a vinyl group-containing polydimethylsiloxane, a vinyl group-containing polyphenylmethylsiloxane, a vinyl group-containing dimethylsiloxane-diphenylsiloxane copolymer, a vinyl group-containing dimethylsiloxane-phenylmethylsiloxane copolymer, and a vinyl group-containing dimethylsiloxane-diethylsiloxane copolymer.

The curing agent is not particularly limited as long as it is capable of curing the silicone compound as the main agent described above, and is preferably an organohydrogen polysiloxane that is an organopolysiloxane with two or more hydrosilyl groups (SiH).

By appropriately adjusting the number of hydrosilyl groups, a molecular weight, and a compounding amount ratio of the curing agent to the main agent, hardness of the primary sheet as described below can be adjusted. Specifically, the hardness of the primary sheet can be lowered by using a curing agent with fewer hydrosilyl groups in one molecule or a larger molecular weight, or by reducing a compounding amount ratio of the curing agent to the main agent.

A content of the polymer matrix in the thermally conductive sheet, when denoted as a volume percentage (filling ratio), is preferably 15 to 50% by volume and more preferably 20 to 45% by volume, with respect to the total amount of the thermally conductive sheet.

(Scaly Filler)

The scaly filler 12 preferably has a first aspect ratio of 1.5 or more, denoted as a ratio of the length in the long axis direction Y to the length in the transverse axis direction X (length of the long axis direction Y/length of the transverse axis direction X).

The scaly filler 12 having the first aspect ratio of 1.5 or more can significantly increase the thermal conductivity in the first direction (thickness direction) higher than the thermal conductivity in the second direction (one direction of the plane direction). This allows the thermal conductivity in the thickness direction to be significantly enhanced and facilitates a heat dissipation effect to be enhanced, while preventing heat from being transferred more than necessary in the plane direction. Moreover, from the viewpoint of increasing the thermal conductivity in the first direction (thickness direction) sufficiently higher than the thermal conductivity along the plane direction, the first aspect ratio is preferably 1.7 or more.

However, the first aspect ratio may be 1 or more, and if the first aspect ratio is, for example, less than 1.5, it becomes difficult to make a significant difference in thermal conductivity in the first and second directions, however, which is suitable for applications that require high thermal conductivity in both the thickness and plane directions.

The first aspect ratio is, for example, 5 or less, preferably 3 or less, and more preferably 2.5 or less, in order to impart a certain level or higher of thermal conductivity in the second direction as well.

From the viewpoint of allowing to facilitate orientation in the first direction (thickness direction) to enhance thermal conductivity, the scaly filler 12 preferably has a second aspect ratio denoted as a ratio of the length in the long axis direction Y to the length in the thickness direction Z (length of long axis direction Y/length of thickness direction Z) of 3 or more and more preferably 6 to 300. In addition, the second aspect ratio is still more preferably 8 to 15 in order to lower a viscosity of a mixture of compounding each material, and on the other hand, from the viewpoint of preventing the scaly filler 12 from falling off from a cured substance and enhancing thermal conductivity, the second aspect ratio is still more preferably 15 to 300. Additionally, the second aspect ratio is usually more than the first aspect ratio.

Further, an average particle size of the scaly filler 12 is preferably 20 μm or larger. Additionally, the average particle size is an average of lengths in long axis direction Y. The average particle size of 20 μm or larger facilitates the scaly filler 12 to be oriented along the first direction (thickness direction), and also facilitates contact between the fillers, which secures a heat transfer path and facilitates thermal conductivity, especially that in the first direction to be enhanced. From the viewpoint of improving thermal conductivity, the average particle size of the scaly filler 12 is more preferably 30 μm or larger, still more preferably 40 μm or larger, and even still more preferably 60 μm or larger.

Further, from the viewpoint of reducing a bulk of the scaly filler 12 and facilitating high filling of the polymer matrix 11, the average particle size of the scaly filler 12 is preferably 400 µm or smaller, more preferably 300 µm or smaller, still more preferably 200 µm or smaller, and even still more preferably 150 µm or smaller.

One type of the scaly filler 12 may be used alone, or two or more types thereof may be combined for use. For example, at least two scaly fillers having different average particle sizes may be used as scaly fillers 12.

Additionally, the aspect ratios (first and second aspect ratios) and the average particle size of the scaly filler 12 can be determined by observing them under a microscope and measuring their respective lengths. For example, for the scaly filler 12 obtained by melting a matrix component of the thermally conductive sheet 10 to separate the fillers, an electron microscope or an optical microscope can be used to measure lengths in the long axis direction of arbitrary 50 scaly fillers 12, then to calculate an average value (arithmetic mean value) thereof as the average particle size. At this time, the scaly filler 12 ought not be subjected to a strong shear so as not to be crushed. Moreover, if it is difficult to separate the scaly filler 12 from the thermally conductive sheet 10, the lengths in the long axis direction Y of the scaly filler 12 may be measured by using an X-ray CT apparatus to calculate an average value (arithmetic mean value) as the average particle size.

Similarly, the length in the long axis direction Y, the length in the transverse axis direction X, and the length in the thickness direction Z (i.e., thickness) of arbitrary 50 scaly fillers 12 may be measured to determine the first and the second aspect ratios from the ratio of the average values (additive mean values).

It is noted that "arbitrary" as used herein refers to selecting at random.

The scaly filler 12 includes scaly carbon powder, scaly silicon carbide powder, scaly aluminum nitride powder, scaly boron nitride powder, scaly aluminum oxide powder, etc. Among them, from the viewpoint of thermal conductivity, at least one selected from the group consisting of scaly graphite powder and scaly boron nitride powder is preferred. Moreover, from the viewpoint of improving thermal conductivity of the scaly filler 12 in particular in the first direction, scaly graphite powder is more preferred.

Scaly graphite powder has a series of graphite crystal planes in the in-plane direction of the scale plane and comprises high thermal conductivity in that in-plane direction. Therefore, aligning the scale planes in a predetermined direction can increase the thermal conductivity in a specific direction. Scaly graphite powder preferably has a high degree of graphitization.

A content of the scaly filler 12 in the thermally conductive sheet 10 is preferably from 8 to 400 parts by mass per 100 parts by mass of the polymer matrix. The content of the scaly filler 12 being 8 parts by mass or more facilitates the thermal conductivity to be increased in the first and second directions, and the content thereof being 400 parts by mass or less facilitates a viscosity of the liquid composition to be described later to be appropriate, rendering orientation of the scaly filler 12 favorable. From these viewpoints, the content of the scaly filler 12 in the thermally conductive sheet 10 is more preferably 40 to 300 parts by mass and still more preferably 70 to 200 parts by mass. Moreover, the content of the scaly filler 12, when denoted as a filling ratio based on volume (volumetric filling ratio), is preferably 5 to 50% by volume, more preferably 8 to 40% by volume, and still more preferably 13 to 30% by volume, relative to the total amount of the thermally conductive sheet.

Additionally, the thermally conductive sheet 10 may be combined for use with other anisotropic fillers such as the fibrous filler 13 as described above, but when combining the scaly filler 12 and the fibrous filler 13 for use, a suitable value for the total amount of the scaly filler 12 and the fibrous filler 13 is as described below.

As described above, the scaly filler 12 is oriented such that the long axis direction Y is along the first direction of the thermally conductive sheet 10 and the transverse axis direction X is along the second direction of the thermally conductive sheet 10.

Here, the long axis direction Y along the first direction refers to the long axis direction Y being in a state of having a proportion of the number of the scaly fillers 12 each in which an angle (orientation angle) formed by the long axis direction Y with respect to the thickness direction of the thermally conductive sheet 10 is less than 30°, exceeding 50% with respect to the total amount of the scaly fillers, and the proportion preferably exceeds more than 80%.

Moreover, the transverse axis direction X along the second direction refers to the transverse axis direction X being in a state of having a proportion of the number of the scaly fillers 12 each in which an angle formed by the traverse axis direction X with respect to the second direction of the thermally conductive sheet 10 is less than 30°, exceeding 50% with respect to the total amount of the scaly fillers, and the proportion preferably exceeds more than 80%.

Additionally, from the viewpoint of increasing the thermal conductivity of the first direction, an angle (orientation angle) formed by the long axis direction Y with respect to the first direction of the scaly filler 12 is preferably 0° or larger and less than 30°, which is an average value of orientation angles of a fixed number of the scaly fillers 12 (for example, 50 arbitrary scaly fillers 12).

Further, from the viewpoint of increasing the thermal conductivity in the second direction, an angle formed by the transverse axis direction X with respect to the second direction of the scaly filler 12 is preferably 0° or larger and less than 30°, which is an average value of angles formed by a fixed number of the scaly fillers 12 (for example, 50 arbitrary scaly fillers 12).

(Fibrous Filler)

The thermally conductive sheet 10 preferably contains the fibrous filler 13 dispersed in the polymer matrix 11 as described above. The fibrous filler 13 preferably has an aspect ratio of 4 or more, more preferably 7 to 100, and still more preferably 15 to 50, from the viewpoint of enhancing the thermal conductivity by facilitating the fiber axis direction thereof to orient in the first direction. It is noted that the aspect ratio refers to the length of the fibrous filler 13 (fiber length) in the fiber axis direction/a diameter of the fiber.

In the present description, the first aspect ratio of the scaly filler 12 and the aspect ratio of the fibrous filler 13 can be said to be, in other words, a ratio of the length of the anisotropic filler in the first direction to the length of the anisotropic filler in the second direction.

Therefore, a weighted average value of the first aspect ratio of the scaly filler 12 and that of the aspect ratio of the fibrous filler 13 (also referred to as the "aspect ratio in the first direction/second direction") can also be said to be a ratio indicating the degree to which the anisotropic filler is oriented in the first direction relative to the second direction.

Additionally, the weighted average value of the aspect ratio is a valued obtained by aspect ratios of each anisotropic filler (the first aspect ratio for the scaly filler 12 or the aspect ratio for the fibrous filler 13) being weighted and averaged with each compounding amount (volume ratio).

Specifically, the aspect ratio in the first direction/second direction can be 1 or more, but it is preferably 1.5 or more, more preferably 1.7 or more, and still more preferably 3 or more. When the aspect ratio is 1.5 or higher, the thermal conductivity in the thickness direction is higher in the present embodiment, and the heat dissipation effect becomes higher when used in electronic devices, etc. Further, the aspect ratio in the first direction/second direction is preferably, for example, 8 or less, more preferably 7 or less, and still more preferably 5 or less. When this aspect ratio is 8 or less, the thermal conductivity in the plane direction is higher, facilitating prevention of heat spots in the present embodiment.

An average fiber length of the fibrous filler 13 is preferably 20 to 500 μm and more preferably 80 to 400 μm. When the average fiber length is 20 μm or longer, the fillers contact with each other in the thermally conductive sheet to ensure a heat transfer path and to have favorable thermal conductivity of the thermally conductive sheet 10. If the average fiber length is 500 μm or shorter, on the other hand, the bulk of the fibrous filler 13 is lowered, enabling high filling thereof. In addition, even if the fibrous filler 13 having electrical conductivity is used, it prevents the electrical conductivity of the thermally conductive sheet 10 from being unnecessarily high.

Additionally, the average fiber length described above can be calculated by observing the fibrous filler 13 with a microscope. For example, for the fibrous fillers 13 obtained by melting a matrix component of the thermally conductive sheet 10 to separate the fillers, fiber lengths of 50 arbitrary fibrous fillers 13 are measured by using the electron microscope or the optical microscope, and then an average value (arithmetic mean value) can be measured as the average fiber length. At this time, a large shear ought not to be applied so that the fibers are not crushed. Further if it is difficult to separate fibrous fillers 13 from the thermally conductive sheet 10, the fiber lengths of the fibrous filler 13 may be measured by using an X-ray CT apparatus to calculate the average fiber length.

Moreover, a diameter of the fibrous filler 13 can also be measured by using the electron microscope, the optical microscope, or the X-ray CT apparatus in the same manner.

The fibrous filler 13 includes a carbon fiber, a metal fiber, a ceramics fiber, a polyparaphenylene benzoxazole fiber, etc. Among them, the carbon fiber is preferred.

The carbon fiber that is a graphitized carbon fiber is preferred. The graphitized carbon fiber has a series of crystal planes of graphite connected in the fiber axis direction and has high thermal conductivity in the fiber axis direction. Therefore, aligning the fiber axis direction in a predetermined direction enables thermal conductivity in a specific direction to be increased. The graphitized carbon fiber preferably has a high degree of graphitization.

A graphitized carbon material such as the graphitized carbon fiber described above that is such that the following raw materials are graphitized, can be used. For example, condensed polycyclic hydrocarbon compounds such as naphthalene, condensed heterocyclic compounds such as PAN (polyacrylonitrile) and pitch are included, and graphitized mesophase pitch having a particularly high degree of graphitization, polyimide and polybenzazole are preferably used. For example, by using the mesophase pitch, in a spinning step described later, the pitch is oriented in the fiber axis direction due to its anisotropy, and the graphitized carbon fiber having excellent thermal conductivity in the fiber axis direction can be obtained.

A mode of use of the mesophase pitch in the graphitized carbon fiber is not particularly limited as long as it is spinnable, and the mesophase pitch may be used singly or combined with another raw material for use. However, the mesophase pitch being used singly, namely, the graphitized carbon fiber having a mesophase pitch content of 100% is particularly preferred from the viewpoint of high thermal conductivity, spinnability and stability of quality.

The graphitized carbon fiber obtained by carrying out each sequential treatment of spinning, infusibilization and carbonization, and then it can be used by graphitizing after crushing or cutting to a predetermined particle size or graphitizing after crushing or cutting after the carbonization. When crushing or cutting before graphitization, a polycondensation reaction and a cyclization reaction facilitates to proceed on a surface newly exposed by crushing upon the graphitization treatment, thereby enhancing the degree of graphitization to enable the graphitized carbon fiber with further improved thermal conductivity to be obtained. When spun carbon fibers are graphitized and then crushed, the carbon fibers after graphitization facilitates to be crushed due to its rigidity, and carbon fiber powder having a relatively narrow fiber length distribution can be obtained by crushing in a short time.

One type of the fibrous filler 13 may be used alone, or two or more may be combined for use. For example, at least two fillers having different average fiber lengths from each other may be used as the fibrous filler 13.

As described above, the fibrous filler 13 is oriented such that the fiber axis direction thereof is along the first direction. Here, the fiber axis direction along the first direction refers to a fiber axis direction being in a state of having a proportion of the number of fibrous fillers 13 each in which an angle formed by the long axis of the fibrous filler 13 with respect to the first direction is less than 30°, exceeding 50% with respect to the total amount of the fibrous fillers, and the proportion preferably exceeds more than 80%.

Additionally, from the viewpoint of increasing the thermal conductivity, the angle (orientation angle) formed by the fiber axis direction of the fibrous filler 13 with respect to the first direction is preferably 0° or larger and less than 5°, which is an average value of orientation angles of a fixed number of fibrous fillers 13 (for example, 50 arbitrary fibrous fillers 13).

When containing the scaly filler 12 and the fibrous filler 13, a mass ratio of the scaly filler 12 and the fibrous filler 13 (scaly filler/fibrous filler) is preferably 20/80 to 95/5, more preferably 30/70 to 90/10, and still more preferably 55/45 to 80/20. When the mass ratio is 20/80 or more, the amount of the scaly filler 12 can become a certain level or more, facilitating the thermal conductivity not only in the first direction but also in the second direction to be improved. Moreover, the mass ratio of 95/5 or less facilitates an effect of containing the fibrous filler 13 to be exhibited, and for example, facilitates to improve the thermal conductivity in the first direction.

A total content of the scaly filler 12 and the fibrous filler 13 in the thermally conductive sheet 10 is preferably 10 to 500 parts by mass with respect to 100 parts by mass of polymer matrix 100. The total content being 10 parts by mass or more facilitates to increase the thermal conductivity, and the total content of 500 parts by mass or less facilitates a viscosity of the liquid composition to be described later to be appropriate, rendering the orientation of each filler favorable.

From these viewpoints, the aforementioned total content of the scaly filler 12 and the fibrous filler 13 in the thermally conductive sheet 10 is more preferably 50 to 350 parts by mass and more preferably 80 to 250 parts by mass. In addition, the total content above, when denoted as a filling ratio based on volume (volumetric filling ratio), is preferably 2 to 50% by volume, more preferably 8 to 40% by volume, and still more preferably 15 to 30% by volume with respect to the total amount of the thermally conductive sheet.

The scaly filler 12 and the fibrous filler 13 are not particularly limited, but each generally has thermal conductivity of 30 W/m·K or higher along a direction having anisotropy (i.e., the long axis direction or the fiber axis direction) and each preferably has 100 W/m·K or higher. The upper limit of the thermal conductivity is not particularly limited, but is, for example, 2,000 W/m·K or lower. A method for measuring thermal conductivity is a laser flash method.

Further, the scaly filler 12 and the fibrous filler 13 may also have electrical conductivity or an insulating property. When the scaly filler 12 and the fibrous filler 13 have the insulating properties, they can enhance the insulating properties in the thickness direction of the thermally conductive sheet 10 in the present embodiment, and thereby they can be suitably used in electrical equipment. Additionally, in the present invention, having electrical conductivity refers to, for example, a case where, for example, a volume resistivity is $1 \times 10^9$ Ω·cm or less. Further, having an insulating property refers to a case where, for example, the volume resistivity exceeds $1 \times 10^9$ Ω·cm.

(Non-Anisotropic Filler)

As described above, the thermally conductive sheet 10 preferably contains a non-anisotropic filler (not shown) in the polymer matrix 11. The non-anisotropic filler is a material that imparts thermal conductivity to the thermally conductive sheet 10 together with the anisotropic fillers such as the scaly filler 12. By containing the non-anisotropic filler, the filler is interposed between anisotropic fillers such as oriented the scaly fillers 12, and a thermally conductive sheet having higher thermal conductivity can be obtained.

The non-anisotropic filler is a filler having substantially no anisotropy in shape, and is a filler that does not orient in a predetermined direction even under an environment where the anisotropic fillers such as the scaly filler 12 orient in the predetermined direction, such as under a shear force action described below.

The non-anisotropic filler has an aspect ratio thereof of less than 2 and more preferably 1.5 or less. The aspect ratio being less than 2 can prevent a viscosity of the liquid composition described below from being increased to enable high filling.

The non-anisotropic filler may have electrical conductivity, but preferably has an insulating property, and in the thermally conductive sheet 10, the fillers compounded (i.e., the scaly filler 12, or the scaly filler 12 and the fibrous filler 13, as well as the non-anisotropic filler) preferably have the insulating property. When having the insulating property, they facilitate the insulating property in the thickness direction of the thermally conductive sheet 10 to be further enhanced in the present embodiment.

The non-anisotropic filler includes, for example, metals, metal oxides, metal nitrides, metal hydroxides, carbon materials, oxides other than metals, nitrides, carbides, etc. In addition, a shape of the non-anisotropic filler includes spherical or amorphous powder.

In the non-anisotropic filler, metals, such as aluminum, copper, nickel, metal oxides, such as aluminum oxide represented by alumina, magnesium oxide, and zinc oxide, and metal nitrides, such as aluminum nitride, can be exemplified.

The metal hydroxide includes aluminum hydroxide. Further, the carbon material includes spheroidal graphite. Oxides, nitrides and carbides other than metals include quartz, boron nitride, silicon carbide, etc. Among the aforementioned fillers, a non-anisotropic filler having the insulating property includes metal oxides, metal nitrides, metal hydroxides and metal carbides.

Moreover, among the non-anisotropic fillers described above, aluminum oxide and aluminum are preferred in terms of high thermal conductivity and facilitation of availability of spherical aluminum compounds, and aluminum hydroxide is preferred in terms of facilitation of availability and capable of enhancing flame retardancy of the thermally conductive sheet. Among them, aluminum oxide is more preferred.

An average particle size of the non-anisotropic filler is preferably 0.1 to 50 μm and more preferably 0.5 to 35 μm. Moreover, it is particularly preferably 1 to 20 μm. The average particle size of 50 μm or smaller is unlikely to cause problems such as disturbing orientation of the anisotropic fillers such as the scaly filler. Further, the average particle size of 0.1 μm or larger allows a specific surface area of the non-anisotropic filler not to become larger than necessary, hardly increases a viscosity of the liquid composition even if a large amount thereof is compounded and facilitates high filling of the non-anisotropic filler.

Additionally, the average particle size of the non-anisotropic filler can be measured by observing it with the electron microscope, etc. More specifically, particle sizes of 50 arbitrary non-anisotropic fillers are measured by using the electron microscope, the optical microscope, and the X-ray CT apparatus in the same manner as in measurement for the scaly filler 12 and the fibrous filler 13, and the average value (arithmetic average value) can be used as the average particle size.

One type of anisotropic filler may be used alone, or two or more types may be combined for use. Additionally, the average particle size of each filler is a value calculated without distinguishing each filler when containing two or more types thereof.

The content of the non-isotropic filler in thermally conductive sheet 10 is preferably in the range of 50 to 1,500 parts by mass, more preferably in the range of 200 to 800 parts by mass, and still more preferably in the range of 250 to 550 parts by mass with respect to 100 parts by mass of the polymer matrix. When the content is 50 parts by mass or more, an amount of the non-anisotropic filler interposed in a gap between the anisotropic fillers such as scaly fillers 12 becomes a certain amount or more, giving favorable thermal conductivity. The content being 1,500 parts by mass or less, on the other hand, can enhance an effect of increasing thermal conductivity depending on the content, and moreover, this does not hinder thermal conduction by the anisotropic fillers such as the scaly filler 12 owing to the non-anisotropic filler. Further, when the content is in the range of 200 to 800 parts by mass, thermally conductive sheet 10 becomes excellent in the thermal conductivity, and the liquid composition also has a suitable viscosity.

Additionally, the content of the non-anisotropic filler, when denoted as % by volume, is preferably 10 to 75% by volume, more preferably 30 to 60% by volume, and still more preferably 35 to 50% by volume, relative to the total amount of the thermally conductive sheet.

(Addition Components)

In the thermally conductive sheet 10, various additives may be further compounded to polymer matrix 11 as long as a function as the thermally conductive sheet 10 is not impaired. Examples of the additive include at least one selected from the group consisting of a dispersant, a coupling agent, an adhesive, a flame retardant, an antioxidant, a colorant, an anti-settling additive, etc. Moreover, when the curable silicone composition is cured as described above, a curing catalyst or the like that promotes curing may be compounded as the additive. The curing catalyst includes a platinum-based catalyst.

[Unit Layer]

The thermal conductive sheet 10 is not particularly limited and composed of a plurality of unit layers 14 by the production method described below. Each unit layer 14 in the thermally conductive sheet 10 contains the scaly filler 12. The plurality of unit layers 14 are laminated along the third direction, as shown in FIG. 1, and adjacent unit layers 14 are bonded to each other.

Each unit layer 14 may contain the scaly filler 12 alone as a thermally conductive filler, or may contain both the scaly filler 12 and the fibrous filler 13, or may contain the scaly filler 12 and the non-anisotropic filler (not shown in FIG. 1). Further, it may contain the scaly filler 12, the fibrous filler 13, and the non-anisotropic filler.

Moreover, each unit layer 14 has substantially the same composition. Therefore, contents of the scaly filler 12, the fibrous filler 13, the non-anisotropic filler, and the polymer matrix in each unit layer 14 are the same as the contents in the thermally conductive sheet, and contents and filling ratios of the scaly filler 12, the fibrous filler 13, the non-anisotropic filler, and the polymer matrix in each unit layer 14 are as described above.

In each unit layer 14, the scaly filler 12 is oriented such that the long axis direction Y is along the first direction and the transverse axis direction X is along the second direction, as described above. Moreover, when the thermally conductive sheet 10 contains the fibrous filler 13, in each unit layer 14, the fibrous filler 13 is oriented such that the fiber axis direction is along the first direction. Further, in each unit layer 14, the polymer matrix 11 is a component that holds the aforementioned thermally conductive fillers, and in each unit layer 14, each thermally conductive fillers described above is compounded so as to be dispersed in the polymer matrix 11.

(Thermal Conductivity)

The thermal conductivity in the first direction of the thermally conductive sheet 10 is, for example, 5 W/(m·K) or higher, preferably 8 W/(m·K) or higher, and more preferably 11 W/(m·K) or higher. The thermal conductivity being the lower limit or higher enables the thermal conductivity in the thickness direction of the thermally conductive sheet 10 to be excellent. Although the upper limit is not limited, the thermal conductivity in the thickness direction of thermally conductive sheet 10 is, for example, 50 W/(m·K) or lower. It is noted that the thermal conductivity is measured by a method conforming to ASTM D5470-06.

Moreover, the scaly filler 12 is oriented such that transverse axis direction X thereof is along the second direction. Therefore, it exhibits high thermal conductivity in the second direction as well. The thermal conductivity in the second direction of the thermally conductive sheet 10 is preferably 2.5 W/(m·K) or higher, more preferably 3 W/(m·K) or higher, and still more preferably 4.5 W/(m·K) or higher. In addition, there is also no upper limit for the thermal conductivity in the second direction of the thermally conductive sheet 10, but it is, for example, 50 W/(m·K) or lower.

Further, the thermal conductive sheet 10 also has thermal conductivity in the third direction (perpendicular to the second direction along the plane direction) that is lower than the thermal conductivity in the first and second directions, due to the orientation of the scaly filler 12 as described above. The thermal conductivity in the third direction of the thermally conductive sheet 10 is preferably lower than 4.5 W/(m·K), more preferably lower than 3 W/(m·K), and still more preferably lower than 2.5 W/(m·K). A lower limit of the thermal conductivity in the third direction of the thermally conductive sheet 10 is not particularly limited, but is, for example, 0.2 W/(m·K) or higher.

Moreover, a level of thermal characteristics in the second direction, calculated by the following equation, is preferably 10% or more. The thermally conductive sheet 10 having the level of 10% or more, has anisotropy in thermal conductivity in the plane direction, allowing heat to be transferred in one direction in the plane direction and enabling to prevent heat from being transferred in other directions. From these points of view, a level of thermal characteristics in the second direction is more preferably 20% or more and still more preferably 50% or more.

Further, the level of thermal characteristics in the second direction may be 100% or less, but from the viewpoint of increasing the thermal conductivity in the thickness direction higher than that in the plane direction to enable excellent heat dissipation, it is preferably 90% or less and more preferably 80% or less.

The level of thermal characteristics in the second direction (%)=(λ2−λ3)/(λ1−λ3)×100

λ1: Thermal conductivity in the first direction
λ2: Thermal conductivity in the second direction
λ3: Thermal conductivity in the third direction A type E hardness of the thermally conductive sheet 10 is, for example, 70 or less. When the thermally conductive sheet 10 having type E hardness of 70 or less ensures flexibility, and for example, allows for favorable followability to a heating element, a radiator or the like to become favorable, facilitating the heat dissipation to be favorable.

Moreover, when used on an adherend having large unevenness, etc., the thermally conductive sheet 10 is preferably extremely flexible, and a type 00 hardness thereof is preferably 62 or less. The thermally conductive sheet 10 having the type 00 hardness of 62 or less provides an extremely flexible thermally conductive sheet and has an extremely favorable followability to a heating element, a radiator or the like. Moreover, from the viewpoint of improving flexibility and enabling excellent followability, etc., the type 00 hardness of the thermally conductive sheet 10 is preferably 50 or less and more preferably 45 or less. On the other hand, the type 00 hardness of thermally conductive sheet 10 is not particularly limited, and is, for example, 15 or more, preferably 18 or more, and more preferably 25 or more.

Further, when prioritizing handleability of the thermally conductive sheet 10, the thermally conductive sheet 10 has the type E hardness of preferably 15 or more and particularly preferably 35 or more. The softer the hardness of thermally conductive sheet 10, the less stress can be applied to a heating element, a radiator, or a substrate on which they are arranged when compressed etc., which is preferred, and the thermally conductive sheet 10 having the type 00 hardness of 15 or more allows the predetermined handleability to be favorable, facilitating it to bond to the adherend. In particular, the type E hardness of 35 or more can provide a sheet excellent in balance between handleability and softness.

Additionally, the type E hardness and the type 00 hardness described above are values measured by using a predetermined durometer according to the method specified in ASTM D2240-05.

The type 00 hardness of the thermally conductive sheet 10 and the primary sheet described below is measured according to ASTM D2240-05. It is noted that the type 00 hardness is a value obtained by adjusting a test piece to a 10 mm thickness, measuring hardness values of both sides of the test piece, and calculating an average value. However, if a thickness of the test piece is thinner than 10 mm, a plurality of sheets is stacked to adjust a thickness of the test piece to a thickness of 10 mm, or a thickness of 10 mm or thicker and closest to 10 mm.

In the present embodiment, the anisotropic fillers such as the scaly filler 12, or the scaly filler 12 and the fibrous filler 13 may expose on either of two surfaces 10A and 10B of the thermally conductive sheet 10. Moreover, the exposed the scaly filler 12, or exposed the scaly filler 12 and the fibrous filler 13 may protrude from both surfaces 10A and 10B each. Exposure of the anisotropic fillers on the surfaces 10A and 10B each of the thermally conductive sheet 10 results in an adherend surface of each of surfaces of 10A and 10B. Additionally, both surfaces 10A and 10B of the thermally conductive sheet 10 become cut surfaces, respectively, by cutting them with a cutting tool described below, and scaly fillers 12, or the scaly filler 12 and the fibrous filler 13 expose on both surfaces 10A and 10B each.

However, at least one of the both surfaces 10A and 10B may be an adhesive surface without the scaly filler exposed.

A thickness of the thermally conductive sheet 10 is appropriately changed according to a shape and application of an electronic device on which the thermally conductive sheet is mounted. The thickness of the thermally conductive sheet 10 is not particularly limited, and may be selected in the range of, for example, 0.1 to 5 mm.

Moreover, a thickness of each unit layer 14 is not particularly limited, but is preferably 0.1 to 10.0 mm. Each unit layer 14 having such a thickness within the above range allows the long axis direction Y and the transverse axis direction X of the scaly filler 12 to be oriented along the first and the second directions, respectively, by flow orientation described below. Further, the fibrous filler 13 when used facilitates the long axis direction of the fibrous filler 13 to be oriented along the first direction. From these viewpoints, a thickness of each unit layer 14 is more preferably 0.3 to 5.0 mm and still more preferably 0.3 to 5.0 mm. It is noted that the thickness of unit layer 14 is a length 14L along the third direction.

The thermally conductive sheet 10 has a compression ratio of, for example, 10 to 65% and preferably 20 to 65% when compressed at 0.276 MPa (=40 psi). When the compression ratio is at or above these lower limits, the sheet becomes more flexible, facilitating to be used by compression for in an electronic device, etc. Moreover, if it is 65% or less, each unit layer 14 does not spread under the pressure of laminating unit layers 14 when producing the thermally conductive sheet 10, facilitating production of the thermally conductive sheet 10 appropriately. From the viewpoint of further improving the flexibility, the compression ratio is more preferably 25% or more. Further, from the viewpoint of preventing each unit layer 14 from spreading upon production, and increasing production efficiency, the compression ratio is preferably 60% or less and more preferably 55% or less.

As will be described below, by bonding the primary sheets to each other with VUV irradiation, the thermal conductive sheet 10 can prevent the compression ratio described above from being high and adjust the ratio within the predetermined range described above. It is noted that the compression ratio in the present invention is a ratio measured when a plurality of unit layers 14 is compressed from a direction perpendicular to the bonding surface where they are bonded to each other, specifically, they may be compressed in the first direction (thickness direction) of the thermally conductive sheet 10. Moreover, the compression ratio is a parameter that indicates a proportion of an amount compressed with respect to an initial thickness, represented by "$(T1-T2)/T1$", assuming that the initial thickness before compression is T1 and a thickness when compressed at a predetermined pressure is T2.

Additionally, the compression ratio may be measured, for example, by cutting a thermally conductive sheet with a size of 10 mm×10 mm and placing a test piece sandwiched between a pedestal with a flat surface and a pressing unit where pressed in parallel.

The thermally conductive sheet 10 is used inside an electronic device, etc. Specifically, the thermally conductive sheet 10 is interposed between the heating element and the radiator, conducts heat generated by the heating element to transfer the heat to the radiator, and dissipates the heat from the radiator. Here, the heating element includes various electronic components such as a CPU, a power amplifier, and a power supply, which are used inside the electronic device. Moreover, the radiator includes a heat sink, a heat pump, a metal housing of the electronic device, etc. Each of both surfaces 10A and 10B of the thermally conductive sheet 10 is in close contact with the heating element and the radiator, respectively and is used by compression.

As described above, the thermal conductive sheet 10 in the present embodiment has high thermal conductivity in the first direction (thickness direction), which provides excellent heat dissipation and constant thermal conductivity in the plane direction, resulting in facilitating prevention of heat spots, etc. Further, since the thermal conductivity is not enhanced in a direction other than one direction in the plane direction, it is possible to prevent heat from being transmitted in that direction in the case of, for example, an element with a low heat resistance being present inside the electronic device.

<Production Method of Thermally Conductive Sheet>

Next, an example of the method for producing the thermally conductive sheet 10 described above will be described.

The present method comprises a mixture preparation step of preparing a mixture containing a resin that is a precursor of the polymer matrix and at least the scaly filler 12 as the thermally conductive filler, a primary sheet preparation step of subjecting the mixture described above to a flow orientation treatment to obtain a primary sheet while orientating the anisotropic filler such as the scaly filler 12, a lamination step of laminating the primary sheets to obtain a laminated block, and a cutting step of cutting the laminated block along a laminating direction. Hereinafter each step will be described in detail.

(Mixture Preparation Step)

In the mixture preparation step, a mixture (liquid composition) containing the resin that is the precursor of the polymer matrix (for example, a curable silicone composition if the resin is a silicone resin), and the scaly filler 12 is prepared. The mixture may be further compounded with the fibrous filler 13 and the non-anisotropic filler as appropriate, and further addition ingredients may also be compounded. The liquid composition is usually a slurry. Each component constituting the liquid composition may be mixed, for example, by using a publicly known kneader, kneading roll, mixer or the like.

Here, a viscosity of the liquid composition of 100 to 10,000 Pa·s is preferred. The liquid composition having the viscosity of 100 Pa·s or higher facilitates the long axis direction Y of the scaly filler 12 to orient in the flow direction (one direction in the sheet surface direction) and facilitates the transverse axis direction X to orient in the direction along the sheet surface direction and perpendicular to the flow direction (the other direction in the sheet surface direction), by applying a shear force to form into a sheet while allowing the filler to flow in the orientation treatment step. In addition, the coatability becomes favorable when the viscosity is 10,000 Pa·s or lower. From these viewpoints, the viscosity of the liquid composition is more preferably 300 to 3,000 Pa·s and still more preferably 400 to 2,000 Pa·s.

Additionally, the viscosity is a viscosity measured by using a rotational viscometer (a Viscometer DV-E, model: Spindle SC4-14 manufactured by Brookfield Asset Management) at a rotational speed of 1 rpm, and the measurement temperature is a temperature upon coating of the liquid composition.

The viscosity of the liquid composition can be adjusted according to a type and amount of the thermally conductive filler described above. Moreover, it can also be adjusted appropriately according to each component constituting the resin. For example, when the liquid composition is a curable silicone composition, the viscosity may be set as described above by appropriately adjusting a molecular weight, etc., of each component constituting the curable silicone composition (alkenyl group-containing organopolysiloxane, organohydrogen polysiloxane, etc.). Further, organic solvents may be compounded into the liquid composition as necessary in order to prepare it to the viscosity above, but the organic solvents are not preferably compounded.

(Primary Sheet Preparation Step)

In the primary sheet preparation step, the liquid composition is formed into a sheet form while applying a shear force to obtain a primary sheet. A base material film may be coated thereon with the liquid composition by, for example, a coating applicator such as a bar coater or a doctor blade, or by extrusion forming, ejection from a nozzle or the like, and such a method can impart a shear force along the coating direction (flow direction) of the liquid composition. Forming the sheet while applying the shear force in this way allows the scaly filler 12 to be oriented such that the long axis direction Y is along the flow direction (one direction in the sheet surface direction) and the traverse axis direction X is along the direction perpendicular to the flow direction (the other direction in the sheet surface direction). In addition, when the fibrous filler is compounded into the liquid composition, the fibrous filler 13 is oriented such that the fiber axis direction thereof is along the flow direction.

Next, the liquid composition formed into a sheet is cured, dried, etc., as necessary to obtain a primary sheet. In the primary sheet, as described above, the long axis direction Y of the scaly filler 12 Y is oriented in one direction of the plane direction and the transverse axis direction X is oriented in the other direction of the plane direction.

Moreover, when the liquid composition contains, for example, a curable silicone composition, curing of the liquid composition is carried out by curing the curable silicone composition. The curing of the liquid composition may be carried out by heating, for example, at a temperature of about 50 to 150° C. In addition, a heating time is, for example, about 10 minutes to 3 hours. Additionally, in the case of compounding a solvent into the curable liquid composition, the solvent may be volatilized by heating upon curing.

A thickness of the primary sheet obtained by curing is preferably in the range of 0.1 to 10.0 mm. The primary sheet having the thickness within the aforementioned range, enables appropriately orientation of the anisotropic filler in particular the scaly filler 12 along the plane direction by the shear force as described above. Moreover, the primary sheet having a thickness of 0.1 mm or thicker can be easily peeled off from the base material film. Further, the primary sheet having a thickness of 10 mm or thinner is prevented from being deformed by its own weight. From these viewpoints, the thickness of the primary sheet is more preferably 0.3 to 5.0 mm and still more preferably 0.5 to 3.0 mm.

The type 00 hardness of the primary sheet is preferably 6 or more. When the hardness is 6 or more, the primary sheet does not spread so much even if a pressure is applied when laminating the primary sheet, and a laminated block having a sufficient thickness can be fabricated. From such a viewpoint, the type 00 hardness of the primary sheet is more preferably 10 or more and still more preferably 15 or more.

Moreover, from the viewpoint of ensuring flexibility of thermally conductive sheet 10 obtained, the type 00 hardness of the primary sheet is preferably 55 or less, more preferably 50 or less, and still more preferably 40 or less.

Further, from the viewpoint of enhancing handleability of thermally conductive sheet 10 obtained, the type E hardness of the primary sheet is preferably 70 or less and more preferably 40 or less. In addition, the type E hardness of the primary sheet is preferably 10 or more and more preferably 30 or more.

(Lamination Step)

Figure 3:
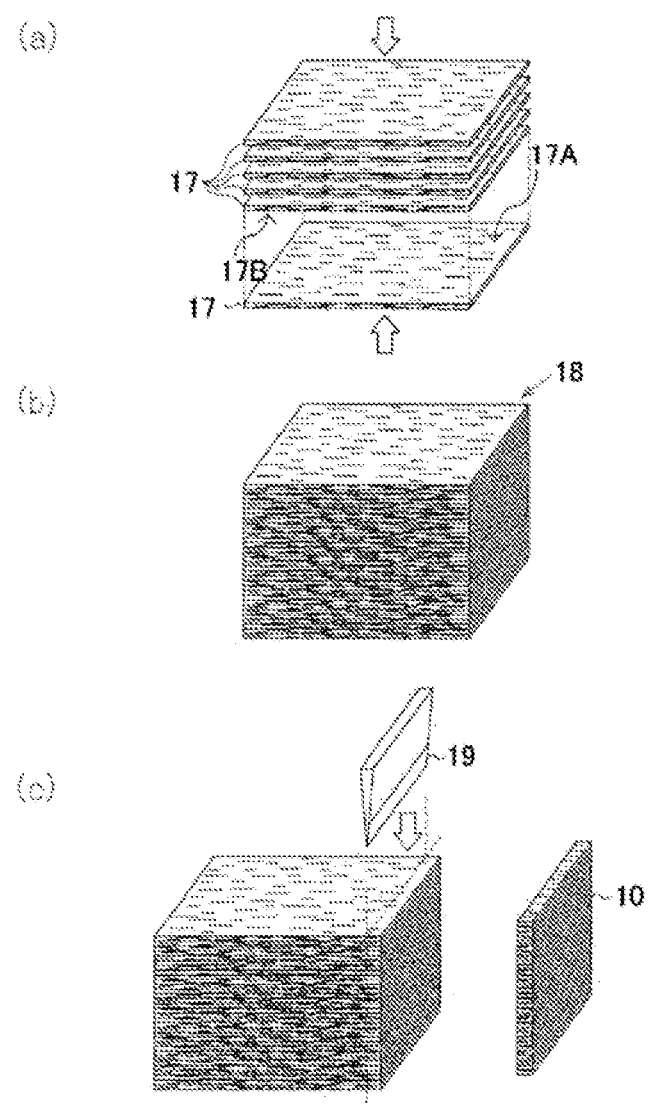
FIG. 3 is a schematic perspective diagram of an example of the method for producing the thermally conductive sheet.

Next, the plurality of primary sheets 17 obtained in the primary sheet preparation step is laminated so that the orientation directions of the scaly fillers are the same (FIGS. 3(*a*) and 3(*b*)). Namely, the sheets are laminated such that one direction which the long axis direction Y of the aforementioned the scaly filler 12 is along and the other direction which the transverse axis direction X is along, respectively are the same as those of each plurality of primary sheets 17. Then the plurality of primary sheets 17 laminated are bonded to each other and integrated to obtain a laminated block 18. For example, when the resin in the plurality of primary sheets 17 laminated is a thermoplastic resin, the polymer matrix 11 in primary sheets 17 may be melted and then solidified by press molding to form the laminated block 18. Moreover, a publicly known adhesive or the like may be arranged between primary sheets 17 to bond them with each other.

Further, when the precursor of the polymer matrix is curable, a plurality of semi-cured primary sheets 17 may be laminated to fully cure each primary sheet after the lamination, and primary sheets 17 may be bonded to each other and integrated by the full curing to form the laminated block 18.

Further, in the case of the polymer matrix being a silicone resin or the like, at least one surface of primary sheets 17 obtained may be irradiated with VUV to activate at least one surface, and to bond primary sheets 17 by taking advantage of the surface. It is noted that VUV refers to is vacuum ultraviolet light, i.e., ultraviolet light with a wavelength of 10 to 200 nm. VUV light sources include an excimer Xe lamp, an excimer ArF lamp, etc.

When primary sheets 17 contain, for example, the silicone resin (organopolysiloxane) as described above, VUV irradiation activates the irradiated surface. Primary sheets 17 would be bonded firmly with each other by overlapping with other primary sheet so that one of the activated surfaces becomes the overlapping surface, as described below.

Although the principle of the adhesion is not known, it is presumed that when the silicone resin is irradiated with VUV, the C—Si bonds of the organopolysiloxane change to Si—O bonds such as Si—OH, resulting in strong bonding between primary sheets 17 due to the Si—O bond. Namely, primary sheet 17 and primary sheet (unit layers 14 and 14) are firmly bonded to each other by intermolecular bonding of the organopolysiloxane. In addition, by bonding primary sheets 17 and 17 to each other by VUV irradiation, flexibility in the direction perpendicular to the laminating direction is not significantly impaired. Therefore, this facilitates to adjust the compression ratio described above within the predetermined range.

VUV irradiation conditions are not particularly limited as long as the conditions are such that the surface of primary sheets 17 can be activated, and, for example, VUV may be irradiated so that an integrated amount of light intensity is 5 to 100 mJ/cm$^2$ and preferably 10 to 50 mJ/cm$^2$.

Here, each primary sheet 17 may have any one of the overlapping surfaces in contact with each other, which is preliminarily irradiated with VUV. One of the surfaces irradiated with VUV allows adjacent primary sheets 17 and 17 to be bonded to each other due to the activated one surface. Moreover, from the viewpoint of further improving an adhesiveness, both of the overlapping surfaces are preferably VUV-irradiated.

Namely, as shown in FIG. 3($a$), primary sheets 17 may be overlapped so that one VUV-irradiated surface 17A is in contact with the other primary sheet 17, and at this time, another surface 17B of the other primary sheet 17, which contacts one surface 17A, is also preferably VUV-irradiated.

With VUV irradiation, primary sheets 17 can be bonded together simply by overlapping them as described above, but in order to bond them more firmly, primary sheets 17 may be pressurized in the laminating direction. The pressure may be applied at a level of not deforming primary sheets 17 significantly, and, for example, can be applied by using rollers or a press. When using a roller as an example, the pressure is preferably 0.3 to 3 kgf/50 mm.

The laminated primary sheets 17 may be heated as appropriate, for example, upon the pressurization, but primary sheets 17 activated by VUV irradiation can be bonded without heating, and therefore the laminated primary sheets 17 are not preferably heated. A temperature upon pressing is, for example, 0 to 50° C. and preferably 10 to 40° C.

(Cutting Step)

Next, as shown in FIG. 3($c$), laminated block 18 is cut along the laminating direction (the third direction) of primary sheets 17 by a blade 19 to obtain the thermally conductive sheet 10. In this case, the laminated block 18 may be cut in a direction orthogonal to one direction (the first direction) which the long axis direction of the scaly filler 12 is along. As blade 19, for example, a double-edged blade or a single-edged blade such as a razor blade or a cutter knife, a round blade, a wire blade, and a saw blade, can be used. The laminated block 18 is cut by, for example, a method such as push-cutting, shear, rotation, sliding or the like, by using blade 19.

Second Embodiment

Next, a second embodiment of the present invention will be described using FIG. 4.

Figure 4:
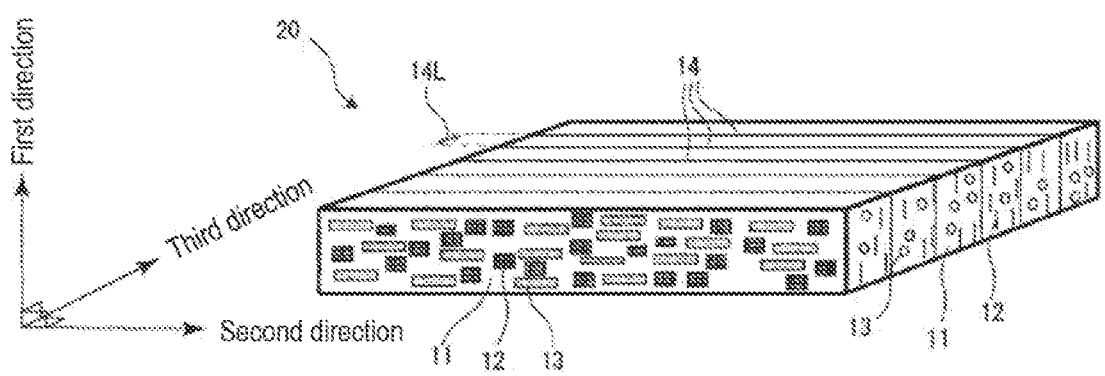
FIG. 4 is a schematic perspective diagram of the thermally conductive sheet according to a second embodiment.

In the first embodiment, the direction along the long axis direction Y of the scaly filler 12 was the thickness direction (first direction) of the sheet, but, as shown in FIG. 4, in a thermally conductive sheet 20 in the present embodiment, the direction along the long axis direction Y of the scaly filler 12 (see FIG. 2) is one direction (second direction) perpendicular to the thickness direction of the sheet, which differs in that the direction along the transverse axis direction X is the thickness direction (first direction) of the sheet.

With such a configuration, even in the present embodiment, the thermal conductivity not only in the thickness direction but also in one direction along the plane direction perpendicular to the thickness direction, becomes favorable, as in the first embodiment. However, since the direction along the long axis direction Y of the scaly filler 12 is the second direction, the thermal conductivity in one direction along the plane direction (the second direction) is higher than that in the thickness direction (the first direction). Therefore, the thermally conductive sheet 20 of the present embodiment can be suitably used for applications in which high thermal conductivity along a plane direction is required.

Regarding thermal conductivity, the thermal conductivity in the first direction is preferably 2.5 W/(m·K) or higher, more preferably 3 W/(m·K) or higher, and still more preferably 4.5 W/(m·K) or higher, and also, for example, 50 W/(m·K) or lower.

The thermal conductivity in the second direction is higher than that in the first direction, and is, for example, 5 W/(m·K) or higher, preferably 8 W/(m·K) or higher, more preferably 11 W/(m·K) or higher, and also, for example, 50 W/(m·K) or lower.

The thermal conductivity in the third direction is lower than the thermal conductivity in the first and the second directions, and is preferably lower than 4.5 W/(m·K), more preferably lower than 3 W/(m·K), and still more preferably lower than 2.5 W/(m·K), and, it is, for example, 0.2 W/(m·K) or higher.

Moreover, the level of thermal characteristics in the second direction is preferably 10% or more as described above, but is usually more than 100%.

Further, the weighted average value of the first aspect ratio of the scaly filler 12 and the aspect ratio of the fibrous filler 13 can be said, in the present embodiment, to be an aspect ratio of the second direction/the first direction. Specifically, the aspect ratio of the second direction/the first direction in the present embodiment may be 1 or more, preferably 1.5 or more, more preferably 1.7 or more, and still more preferably 3 or more, and preferably 8 or less, also more preferably 7 or less, and still more preferably 5 or less.

The thermally conductive sheet 20 in the present embodiment may contain other fillers, such as the fibrous filler 13 and the non-anisotropic filler, as in the first embodiment. When the fibrous filler 13 is compounded, the fibrous filler 13 may be oriented such that the fiber axis direction is along the second direction as well.

Moreover, each physical property and dimensions, such as a thickness of the sheet, a thickness of a unit layer 14L, the type E hardness of the thermally conductive sheet, and a compression ratio when compressed in the thickness direction at 0.276 MPa, are as described in the first embodiment above, and other each configuration in the second embodiment is also the same as in the first embodiment above, and the detailed description thereof will be omitted.

Additionally, the method for producing the thermally conductive sheet 20 in the present embodiment can be carried out in the same manner as in the first embodiment, except that in the cutting step, a sheet is cut in a direction orthogonal to one direction which the transverse axis direction of the scaly filler 12 is along.

Additionally, in the description of each embodiment above, the aspect has been described such that each unit layer 14 in the thermally conductive sheet 20 substantially has the same composition as described above, but the composition of each unit layer 14 may differ from each other.

For example, each unit layer 14 does not necessarily contain the same content of the scaly filler 12, or the scaly filler 12 and the fibrous filler 13 as each other, and the content of the scaly filler 12 or the fibrous filler 13 in a portion of unit layers 14 may be different from the content of the scaly filler 12 or the fibrous filler 13 in the other unit layers 14. Similarly, the content of the non-anisotropic filler in a portion of unit layers 14 may also be different from the content of the non-anisotropic filler in the other unit layers 14. In addition, at least any type of the scaly filler 12, the fibrous filler 13, and the non-anisotropic filler in a portion of unit layers 14 may be different from that in the other unit layers 14.

Further, a plurality of unit layers 14 does not all contain the scaly filler 12, and a portion of unit layers 14 may contain the scaly filler 12, and, for example, an aspect such that at least one unit layer 14 of a plurality of unit layers 14 contains the scaly filler 12, may be adopted. Namely, in each of the embodiments above, the scaly filler 12 along one direction of the first direction and one direction of the second direction is not necessarily contained in all regions of the thermally conductive sheet 20, and the scaly filler 12 along one direction of the first and second directions in a portion of the thermally conductive sheets 20 may be contained.

Similarly, a portion of the plurality of unit layers 14 may contain the fibrous filler 13 and the other unit layers may not contain the fibrous filler 13. Moreover, a portion of the plurality of unit layers 14 may contain the non-anisotropic filler and the other unit layers may not contain the non-anisotropic filler.

As described above, by adjusting the contents, types, etc., of the scaly filler 12 and the fibrous filler 13 in each unit layer 14, the thermal conductivity of a portion of unit layers 14 may be made higher than that of the other unit layers 14. In such a case, unit layer 14 with high thermal conductivity and unit layer 14 with low thermal conductivity may be arranged alternately but need not be arranged alternately.

Similarly, the electrical conductivity of a portion of unit layers 14 may be made lower than the electrical conductivity of the other unit layers 14. In such a case as well, the unit layer with higher electrical conductivity and unit layer 14 with lower electrical conductivity may be arranged alternately but need not arranged alternately. The electrical conductivity of a portion of unit layers 14 being lower than that of the other unit layers 14 prevents electrical conduction along the third direction (see, FIG. 1) due to the portion of unit layers 14 with lower electrical conductivity. As a result, the electrical conductivity in the third direction is lowered for the entire thermally conductive sheet 20, facilitating to ensure insulation. Additionally, in order to facilitate to ensure the insulation more, preferably unit layer 14 with low electrical conductivity does not contain a thermally conductive filler with electrical conductivity but contains a thermally conductive filler with an insulating property.

Moreover, a portion of a plurality of unit layers 14 may be unit layers 14 with relatively high thermal conductivity, and a portion of the other unit layers 14 may be unit layers 14 with light transmittance. Unit layer 14 with thermal conductivity is a layer containing thermally conductive fillers, such as the thermally conductive filler, the scaly filler 12, etc., as described above. Unit layer 14 with light transmittance, on the other hand, may be a layer that does not contain the thermally conductive filler, for example. With such a configuration, the entire thermally conductive sheet 20 will also have a certain level of thermal conductivity and light transmittance along the thickness direction. Unit layer 14 with thermal conductivity and unit layer 14 with light transmittance may be arranged alternately but need not be arranged alternately.

Further, the orientation direction of long axis direction Y of the scaly filler 12 of each unit layer 14 is not entirely aligned in the same direction (i.e., in the first and second directions). Namely, in the present invention, the orientation direction of the long axis direction Y may be one direction of the first direction or second direction in at least a portion of unit layers 14, and the orientation direction of the transverse axis direction X may be the other direction of the first direction of second direction. For example, each unit layer 14 may be sequentially laminated so that an angle between the first directions of each unit layer is 90° or while varying the angle arbitrarily.

Of course, configuration other than the thermally conductive filler may be changed for each unit layer 14. For example, types of the polymer matrix 11 of a portion of unit layers 14 may be changed from types of polymer matrix 11 of the other unit layers 14. Moreover, the presence or absence of an additive component, types and amounts of the additive component in a portion of unit layers 14 may be different from those of the other unit layers 14.

For example, by allowing at least a portion of a type or amount of a silicone resin and a type or amount of the thermally conductive filler, in each of a portion of unit layers 14 to be different from those in the other unit layers 14, the hardness (type E hardness or type 00 hardness) of the portion of unit layers 14 may be made different from that of the other unit layers 14.

EXAMPLES

Hereinafter, the present invention will be described in more detail with reference to Examples, but the present invention is not limited to these Examples at all.

The evaluation method in Examples is as follows.

[Measurement of Viscosity of Liquid Composition (Mixture)]

A viscosity of the liquid composition of each Example was measured with a viscometer (a rotational viscometer DV-E manufactured by Brookfield Asset Management) using a rotor of spindle SC4-14 at a rotation rate of 1 rpm and a measurement temperature of 25° C. The results are shown in Table 1.

[Thermal Conductivity]

The thermal conductivity in the thickness direction (first direction) of the thermally conductive sheet fabricated was measured by the method complying with ASTM D5470-06. Moreover, the thermal conductivity in the second direction and the third direction was also measured by the method complying with ASTM D5470-06. The results are shown in Table 1.

Additionally, the thermal conductivity in the second direction is thermal conductivity measured with a test piece (thickness of 2 mm) obtained by having cut the laminated block of each Example described below so that the second direction was the thickness direction, and the thermal conductivity in the third direction was thermal conductivity obtained by having measured the primary sheet of each Example (thickness of 2 mm).

It is noted that the level of thermal characteristics in the second direction is denoted as a percentage. Specifically, it was calculated by the following equation so that an equivalent to the level in the first direction was "100%" and an equivalent to the level in the third direction was "0%".

The level of thermal characteristics in the second direction (%)=(λ2−λ3)/(λ1−λ3)×100

λ1: Thermal conductivity in the first direction
λ2: Thermal conductivity in the second direction
λ3: Thermal conductivity in the third direction

[Type E Hardness]

Five sheets of thermally conductive sheets and primary sheets obtained from each of Examples and Comparative Examples were stacked to obtain a 10 mm-thick test piece, and the type E hardness of the test piece was measured according to ASTM D2240-05. The results are shown in Table 1.

[Compression Ratio]

The compression ratio of the thermally conductive sheets obtained in each of Examples and Comparative Examples was measured by preparing a sample with an outline of 10 mm×10 mm, upon compression at 0.276 MPa (=40 psi) as described in the description. The results are shown in Table 1.

Example 1

As a curable silicone composition, an alkenyl group-containing organopolysiloxane (main agent) and a hydrogen organopolysiloxane (curing agent) (total of 100 parts by mass, volumetric filling ratio of 38% by volume), 180 parts by mass of boron nitride powder as the scaly filler (average long axis length of 40 μm, first aspect ratio=1, second aspect ratio=4 to 8, and thermal conductivity of 100 W/(m·K)) (volumetric filling ratio of 30%), and 340 parts by mass of aluminum oxide as the non-anisotropic filler (spherical, average particle size of 3 μm, aspect ratio of 1.0) (volumetric filling ratio of 32% by volume) were mixed to obtain a slurry-like liquid composition (mixture). The viscosity of the liquid composition at 25° C. was 480 Pa·s.

The base material film made of polyethylene terephthalate (PET) was coated thereon with the liquid composition in one direction at 25° C. by using a bar coater as a coating applicator. The scaly filler was oriented such that the long axis direction Y was along the coating direction and the transverse axis direction X was along one direction of the sheet surface direction as well as the direction perpendicular to the coating direction. Next, the coating liquid composition was heated at 120° C. for 0.5 hours to cure the liquid composition, and to obtain a primary sheet with a thickness of 2 mm.

Both surfaces of each of the primary sheets obtained were irradiated by using a VUV irradiation apparatus (product name Excimer MINI, manufactured by Hamamatsu Photonics K. K.) at room temperature (25° C.) in air with an amount of integrated light intensity of 20 mJ/cm² on the surface of the sheet. The VUV-irradiated primary sheets were then laminated in 100 sheets, placed on a roller and pressed by a roller in an environment of 25° C. at a pressure of 1.6 kgf/50 mm to obtain a laminated block. The laminated block obtained was sliced with a cutter blade in the direction parallel to the laminating direction and perpendicular to the direction which the long axis direction of the scaly filler was along, to obtain a thermally conductive sheet having a thickness of 2 mm of each unit layer and a thickness of 2 mm of the sheet.

In the thermally conductive sheet, the scaly filler was oriented such that the long axis direction was along the thickness direction (first direction) and the transverse axis direction was along the direction perpendicular to the first direction in the sheet surface direction (second direction). It is noted that the same applies for each of the following Examples.

Example 2

Preparation of the liquid composition was carried out in the same manner as in Example 1, except that scaly graphite powder (average long axis length of 130 μm, first aspect ratio=2, second aspect ratio=6 to 13, and thermal conductivity of 400 W/(m·K)) was used as the scaly filler, and the compounded parts of each filler were changed as described in Table 1.

It is noted.

It is noted that the volumetric filling ratio of the silicone resin was 38% by volume, the volumetric filling ratio of the scaly filler was 23% by volume, the volumetric filling ratio of the non-anisotropic filler was 39% by volume, and the viscosity of the liquid composition at 25° C. was 600 Pa·s.

Example 3

Preparation of the liquid composition was carried out in the similar manner as in Example 1 except that scaly graphite powder (average long axis length of 80 μm, first aspect ratio=1.85, second aspect ratio=4 to 8, and thermal conductivity of 400 W/(m·K)) was used as the scaly filler, and the compounded parts of each filler were changed as described in Table 1. The volumetric filling ratios of the silicone resin and each filler were the same as in Example 2, and the viscosity of the liquid composition at 25° C. was 750 Pa·s.

Example 4

Preparation of the liquid composition was carried out in the similar manner as in Example 1 except that scaly graphite powder (average long axis length of 40 μm, first aspect ratio=1.7, second aspect ratio=3 to 6, and thermal conductivity of 400 W/(m·K)) was used as the scaly filler, and the compounded parts of each filler material were changed as described in Table 1. The volumetric filling ratios of the silicone resin and each filler was the same as in Example 2, and the viscosity of the liquid composition at 25° C. was 940 Pa·s.

Example 5

Preparation of the liquid composition was carried out in the same manner as in Example 4, except that graphitized carbon fiber (average fiber length of 100 μm, aspect ratio of 10, and thermal conductivity of 500 W/(m·K)) was compounded as the fibrous filler, and the compounded parts of each filler were changed as described in Table 1. It is noted that the fibrous filler was oriented such that the fiber axis direction was along the thickness direction (first direction), and the same applies for the following Examples and Comparative Examples.

Additionally, the volumetric filling ratio of the silicone resin was 38% by volume, the volumetric filling ratio of the scaly filler was 9% by volume, the volumetric filling ratio of the fibrous filler was 14% by volume, and the volumetric filling ratio of the non-anisotropic filler was 39% by volume, and the viscosity of the liquid composition at 25° C. was 750 Pa·s.

Example 6

Preparation of the liquid composition was carried out in the same manner as in Example 5, except that the compounded parts of each filler were changed as described in Table 1. It is noted that the volumetric filling ratio of the silicone resin was 38% by volume, the volumetric filling ratio of the scaly filler was 14% by volume, the volumetric filling ratio of the fibrous filler was 9% by volume, and the volumetric filling ratio of the non-anisotropic filler was 39%, and the viscosity of the liquid composition at 25° C. was 540 Pa·s.

Example 7

Preparation of the liquid composition was carried out in the same manner as in Example 4, except that the compounded parts of each filler were changed as described in Table 1. It is noted that the volumetric filling ratio of the silicone resin was 38% by volume, the volumetric filling ratio of the scaly filler was 22% by volume, and the volumetric filling ratio of the non-anisotropic filler was 40% by volume, and the viscosity of the liquid composition at 25° C. was 960 Pa·s.

Comparative Example 1

Preparation of the liquid composition was carried out in the same manner as in Example 1, except that the scaly filler was not used and the compounded parts of each filler were changed as described in Table 1. It is noted that the volumetric filling ratio of the silicone resin was 37% by volume, the volumetric filling ratio of the fibrous filler was 20% by volume, and the volumetric filling ratio of the non-anisotropic filler was 43% by volume, and the viscosity of the liquid composition at 25° C. was 360 Pa·s.

Comparative Example 2

The preparation of the liquid composition was carried out in the same manner as in Example 1, except that the scaly filler was not used and the compounded parts of each filler were changed as described in Table 1. It is noted that the volumetric filling ratio of the silicone resin was 38% by volume, the volumetric filling ratio of the fibrous filler was 22% by volume, and the volumetric filling ratio of the non-anisotropic filler was 40% by volume, and the viscosity of the liquid composition at 25° C. was 450 Pa·s.

TABLE 1

| | | Example 1 | Example 2 | Example 3 | Example 4 | Example 5 | Example 6 | Example 7 | Comparative Example 1 | Comparative Example 2 |
|---|---|---|---|---|---|---|---|---|---|---|
| Silicone resin (parts by mass) | | 100 | 100 | 100 | 100 | 100 | 100 | 100 | 100 | 100 |
| Scale graphite (130 μm) (parts by mass) | | | 135 | | | | | | | |
| Scale graphite (80 μm) (parts by mass) | | | | 135 | | | | | | |
| Scale graphite (40 μm) (parts by mass) | | | | | 135 | 50 | 80 | 130 | | |
| Boron nitride (40 μm) (parts by mass) | | 180 | | | | | | | | |
| Carbon fiber (100 μm) (parts by mass) | | | | | | 80 | 50 | | 120 | 130 |
| Aluminum oxide (3 μm) (parts by mass) | | 340 | 400 | 400 | 400 | 400 | 400 | 400 | 450 | 400 |
| Viscosity (Pa · s) | | 480 | 600 | 750 | 940 | 750 | 540 | 960 | 360 | 450 |
| Type E hardness | Thermally conductive sheet | 45 | 67 | 65 | 60 | 44 | 58 | 59 | 30 | 30 |
| | Primary sheet | 38 | 62 | 60 | 54 | 37 | 48 | 54 | 23 | 25 |
| Compression ratio (%) | | 30 | 10 | 12 | 13 | 28 | 19 | 14 | 42 | 35 |
| Thermal conductivity (W/m · K) | First direction | 6 | 13.5 | 13 | 13.5 | 13.8 | 13.8 | 12 | 12 | 12 |
| | Second direction | 6 | 11 | 11.5 | 11 | 3.5 | 5 | 10 | 2 | 2 |
| | Third direction | 1.5 | 2 | 2 | 1.8 | 2 | 2 | 2 | 2 | 2 |
| Thermal characteristics level of second direction | | 100% | 78% | 86% | 79% | 13% | 25% | 80% | 0% | 0% |
| Aspect ratio of first direction/second direction | | 1 | 2 | 1.85 | 1.7 | 6.8 | 4.9 | 1.7 | 10 | 10 |

The thermally conductive sheet of each Example above, containing the scaly filler and allowing it to be oriented such that the long axis direction Y was along the first direction and the transverse axis direction X was along the second direction, improved the thermal conductivity not only in the thickness direction (the first direction) but also in one direction along the plane direction (the second direction). Therefore, the thermal conductivity in the thickness direction and one direction along the plane direction became satisfactory, lowering the thermal resistance in these directions.

On the contrary, the thermally conductive sheet in each Comparative Example did not contain the scaly filler oriented such that the long axis direction Y was along the first direction and the transverse axis direction X was along the second direction, so that the thermal conductivity in both the thickness direction and one direction along the plane direction was not improved, thereby not enabling to lower the thermal resistance in both the thickness direction and one direction along the plane direction.

REFERENCE SIGNS LIST

10, 20 thermally conductivity sheet
10A surface in one direction
10B surface in other direction 11 polymer matrix
12 scaly filler
13 fibrous filler
14 unit layer
17 primary sheet
18 laminated block
19 blade

The invention claimed is:

1. A thermally conductive sheet comprising a scaly filler in a polymer matrix, wherein
the scaly filler is oriented such that a long axis direction of a scale surface is along one of a first direction that is a thickness direction of the thermally conductive sheet and a second direction that is perpendicular to the first direction, and a transverse axis direction that is perpendicular to the long axis direction in the scale surface is along the other of the first direction and the second direction.

2. The thermally conductive sheet according to claim 1, wherein the scaly filler is oriented such that the long axis direction is along the first direction and the transverse axis direction is along the second direction.

3. The thermally conductive sheet according to claim 1, wherein the scaly filler is oriented such that the transverse axis direction is along the first direction and the long axis direction is along the second direction.

4. The thermally conductive sheet according to claim 1, wherein a first aspect ratio represented by a ratio of a length in the long axis direction to a length in the transverse axis direction, of the scaly filler (length in the long axis direction/ length in the transverse axis direction) is 1.5 or more.

5. The thermally conductive sheet according to claim 1, wherein an average particle size of the scaly filler is 20 μm or larger.

6. The thermally conductive sheet according to claim 1, wherein the scaly filler comprises scaly graphite powder.

7. The thermally conductive sheet according to claim 1, wherein the scaly filler comprises scaly boron nitride powder.

8. The thermally conductive sheet according to claim 1, wherein the thermally conductive sheet further comprises a fibrous filler in the polymer matrix.

9. The thermally conductive sheet according to claim 8, wherein the fibrous filler is a carbon fiber.

10. The thermally conductive sheet according to claim 1, wherein
the thermally conductive sheet comprises a plurality of unit layers, wherein at least one of the plurality of unit layers comprises the scaly filler, and
the plurality of unit layers are laminated along a third direction perpendicular to the first and second directions.

11. The thermally conductive sheet according to claim 1, wherein the thermally conductive sheet further comprises a non-anisotropic filler in the polymer matrix.

* * * * *